US012471445B2

(12) United States Patent
Shim

(10) Patent No.: US 12,471,445 B2
(45) Date of Patent: Nov. 11, 2025

(54) ELECTROLUMINESCENCE DISPLAY APPARATUS

(71) Applicant: LG Display Co., Ltd., Seoul (KR)

(72) Inventor: Sungbin Shim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 804 days.

(21) Appl. No.: 17/543,522

(22) Filed: Dec. 6, 2021

(65) Prior Publication Data

US 2022/0181399 A1 Jun. 9, 2022

(30) Foreign Application Priority Data

Dec. 7, 2020 (KR) ........................ 10-2020-0169660

(51) Int. Cl.

| | |
|---|---|
| ***H10K 59/122*** | (2023.01) |
| ***H10K 59/131*** | (2023.01) |
| ***H10K 59/35*** | (2023.01) |
| *H10K 59/80* | (2023.01) |

(52) U.S. Cl.

CPC ......... *H10K 59/122* (2023.02); *H10K 59/131* (2023.02); *H10K 59/353* (2023.02); *H10K 59/1315* (2023.02); *H10K 59/80517* (2023.02); *H10K 59/8052* (2023.02); *H10K 59/873* (2023.02)

(58) Field of Classification Search

CPC ... H10K 59/122; H10K 50/824; H10K 59/131
See application file for complete search history.

(56) References Cited

U.S. PATENT DOCUMENTS

| | | | | |
|---|---|---|---|---|
| 9,570,471 | B2 * | 2/2017 | Heo | H10D 86/423 |
| 10,109,700 | B2 * | 10/2018 | Jang | H10K 59/80517 |
| 11,716,877 | B2 * | 8/2023 | Heo | H10K 59/80522 257/40 |

(Continued)

FOREIGN PATENT DOCUMENTS

| | | |
|---|---|---|
| KR | 10-2016-0006110 A | 1/2016 |
| KR | 10-2018-0013225 A | 2/2018 |
| KR | 10-2020-0049223 A | 5/2020 |

OTHER PUBLICATIONS

Korean Intellectual Property Office, Office Action, Korean Patent Application No. 10-2020-0169660, Jul. 11, 2024, 13 pages.

*Primary Examiner* — Bac H Au
(74) *Attorney, Agent, or Firm* — Fenwick & West LLP

(57) ABSTRACT

An electroluminescence display apparatus includes a substrate including a plurality of subpixel areas including an emission area and a non-emission area surrounding the emission area and a cathode contact area located on at least one side between the plurality of subpixel areas, a planarization layer disposed on the substrate and configured to overlap each of the emission area and the cathode contact area, a light emitting device disposed on the planarization layer and configured to overlap the emission area, and including a pixel electrode and a cathode electrode facing the pixel electrode, and a cathode contact electrode formed on the planarization layer and formed to overlap at least a portion of the non-emission area, wherein the cathode contact electrode includes one side surface exposed toward the cathode contact area, and the cathode electrode is in contact with the one side surface of the cathode contact electrode.

19 Claims, 7 Drawing Sheets

(56) References Cited

U.S. PATENT DOCUMENTS

| | | | | |
|---|---|---|---|---|
| 12,022,675 | B2 * | 6/2024 | Shin | H10K 50/816 |
| 12,101,955 | B2 * | 9/2024 | Shim | H10K 59/1315 |
| 2016/0013438 | A1 * | 1/2016 | Im | H10K 59/80517<br>257/762 |
| 2016/0351638 | A1 * | 12/2016 | Im | H10K 50/84 |
| 2017/0125506 | A1 * | 5/2017 | Kim | G09G 3/3225 |
| 2018/0097047 | A1 * | 4/2018 | Jung | H10K 59/124 |
| 2018/0122877 | A1 * | 5/2018 | Beak | H10K 59/1216 |
| 2018/0342564 | A1 * | 11/2018 | Hanari | H10K 50/844 |
| 2019/0115403 | A1 * | 4/2019 | Kang | H10D 86/441 |
| 2019/0189717 | A1 * | 6/2019 | Choi | H10K 59/124 |
| 2019/0207168 | A1 * | 7/2019 | Lee | H10K 50/844 |
| 2019/0326372 | A1 * | 10/2019 | Han | G09G 3/3233 |
| 2020/0135838 | A1 * | 4/2020 | Han | H10K 50/824 |
| 2020/0161382 | A1 * | 5/2020 | Lee | G06F 3/04166 |
| 2021/0193954 | A1 * | 6/2021 | Shin | H10K 59/122 |
| 2021/0202608 | A1 * | 7/2021 | Lee | H10K 59/80522 |
| 2021/0408441 | A1 * | 12/2021 | Lee | H10K 50/814 |
| 2022/0165980 | A1 * | 5/2022 | Shim | H10K 59/38 |

* cited by examiner

ELECTROLUMINESCENCE DISPLAY APPARATUS

CROSS-REFERENCE TO RELATED APPLICATIONS

This application claims the benefit of Republic of Korea Patent Application No. 10-2020-0169660 filed on Dec. 7, 2020, which is hereby incorporated by reference as if fully set forth herein.

BACKGROUND

Field

The present disclosure relates to an electroluminescence display apparatus, and more particularly, to an electroluminescence display apparatus in which a moisture barrier structure is applied to a cathode contact area.

Discussion of the Related Art

As the information society develops, demand for display apparatus for displaying images has increased in various forms, and in recent years, various display apparatus such as a liquid crystal display (LCD), a plasma display, and an organic light emitting display (OLED) have been used.

An electroluminescence display apparatus includes an array device and a light emitting device. The array device includes a switching thin film transistor (TFT) connected to gate and data lines and at least one driving TFT connected to the light emitting device, and the light emitting device includes a pixel electrode connected to the driving TFT, a light emitting layer, and a cathode electrode.

However, the electroluminescence display apparatus having the configuration described above has a problem in that luminance non-uniformity occurs due to increased resistance of the cathode electrode of the light emitting device. Accordingly, there is a need for a cathode electrode structure having a uniform resistance over the entire display area of the electroluminescence display apparatus. In addition, a cathode contact structure provided on at least one side of the electroluminescence display acts as a movement path of moisture, causing a reliability problem.

SUMMARY

An electroluminescence display apparatus of a related art has a problem in that luminance non-uniformity occurs due to increased resistance of a cathode electrode of a light emitting device and reliability problem due to moisture permeability in a structure for lowering the cathode electrode. Therefore, the inventors of the present disclosure provide an electroluminescence display apparatus with high reliability against moisture, while providing uniform resistance of a cathode electrode over the entire active area of the electroluminescence display apparatus.

Accordingly, the present disclosure is directed to providing an electroluminescence display apparatus that substantially obviates one or more problems due to limitations and disadvantages of the related art.

An aspect of the present disclosure is directed to providing an electroluminescence display apparatus with high reliability for moisture permeability, while a cathode electrode and an auxiliary power line are stably in contact with each other.

The problems to be solved according to an embodiment of the present disclosure are not limited to the problems mentioned above, and other problems not mentioned will be clearly understood by those skilled in the art from the following description.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electroluminescence display apparatus including a substrate including a plurality of subpixel areas including a emission area and a non-emission area surrounding the emission area and a cathode contact area located on at least one side between the plurality of subpixel areas, a planarization layer disposed on the substrate and configured to overlap each of the emission area and the cathode contact area, a light emitting device disposed on the planarization layer and configured to overlap the emission area, and including a pixel electrode and a cathode electrode facing the pixel electrode, and a cathode contact electrode formed on the planarization layer and formed to overlap at least a portion of the non-emission area, wherein the cathode contact electrode includes one side surface exposed toward the cathode contact area, and the cathode electrode is in contact with the one side surface of the cathode contact electrode.

In another embodiment, a display apparatus includes a substrate including a plurality of subpixel areas including a first subpixel area, a second subpixel area, and a contact area between the first subpixel area and the second subpixel area, a light emitting device in the first subpixel area on an insulation layer, the light emitting device including a first electrode, a light emitting layer, and at least a part of a second electrode, a first contact electrode configured to receive voltage from a first power line on the substrate, wherein at least a part of the first contact electrode extends from an area within a contact hole formed in the insulation layer to an upper surface of the insulation layer, and a bank on at least the first electrode of the light emitting device and the first contact electrode, wherein a portion of the bank protrudes beyond a side surface of the first contact electrode, and wherein at least a portion of the second electrode contacts the side surface of the first contact electrode in an area below the bank.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
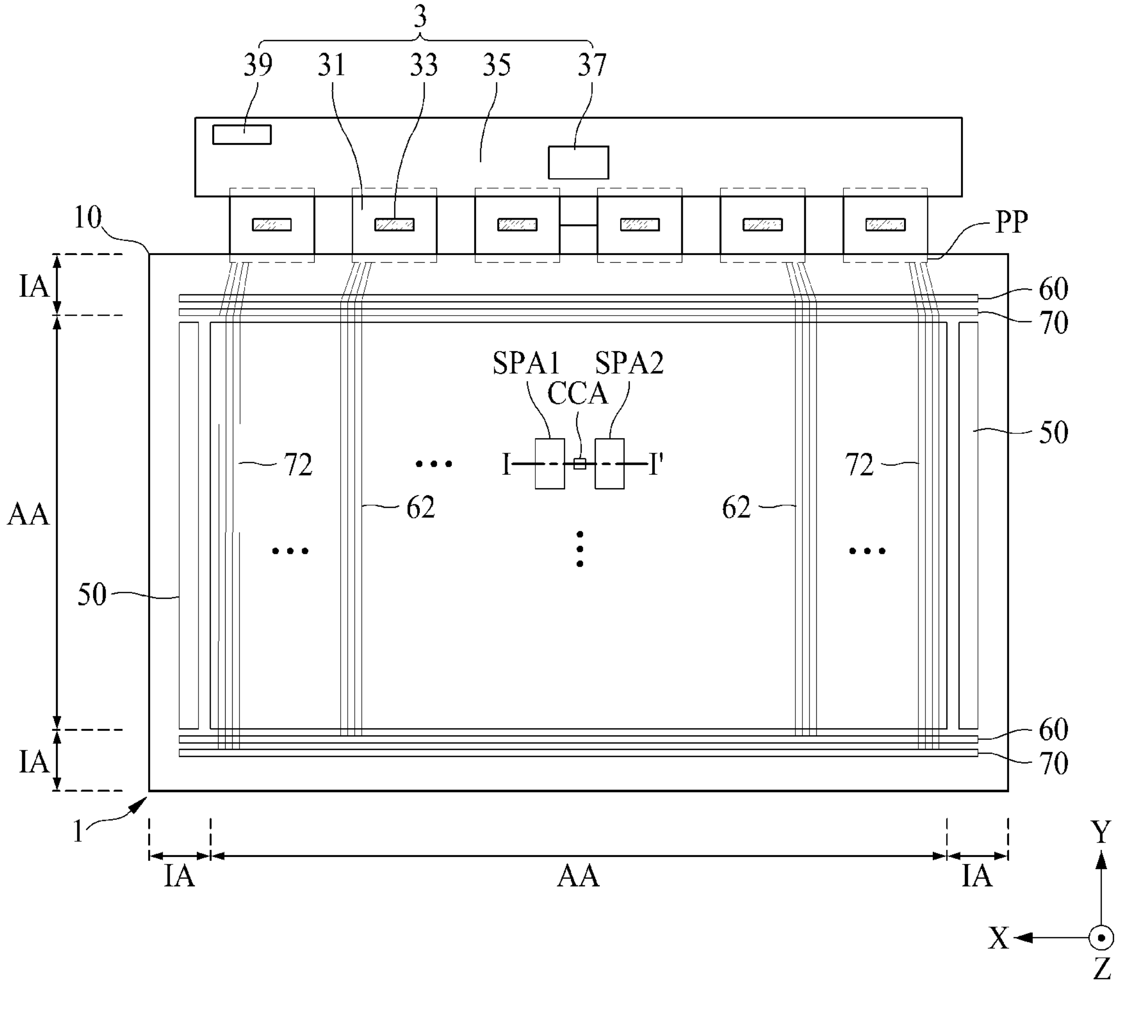
FIG. 1 is a plan view of an electroluminescence display apparatus according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after', 'subsequent', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it may be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a plan view according to an embodiment of the present disclosure.

Referring to FIG. 1, an electroluminescence display apparatus according to an embodiment of the present disclosure may include a light emitting display panel 1 and a panel driving circuit unit 3.

The display panel 1 may include a substrate 10, an active area AA, an inactive area, a first power line 60, a second power line 70, and a gate driving circuit 50.

The substrate 10 may be a glass substrate, a bendable thin glass substrate, a plastic substrate, or a silicon wafer substrate.

The active area AA is an area in which an image is displayed, and may also be expressed as a first area, a display portion, a display area, or an active portion. For example, the active area AA may be disposed in a portion other than an edge portion of the substrate 10.

The inactive area IA is an area in which an image is not displayed, and may also be expressed as a second area, a non-display portion, a non-display area, or an inactive portion. For example, the non-display portion may be disposed at an edge portion of the substrate 10 to surround the active area AA.

The active area AA may include a plurality of subpixels, and may include a cathode contact area CCA formed in at least a portion between the plurality of subpixels.

In FIG. 1, a structure of the active area AA may include a first subpixel area SPA1, a second subpixel area SPA2 adjacent to the first subpixel area SPA1, and a cathode contact area CCA positioned between the first subpixel area SPA1 and the second subpixel area SPA2.

Here, the cathode contact area CCA may be defined as a certain area including a region in which a portion of a side surface of a cathode contact electrode 270, which will be described later, is exposed to contact a first power link line 62 and a cathode electrode 250 of the light emitting device 200. A detailed structure of the cathode contact area CCA will be described later with reference to FIGS. 2 and 3.

Also, in FIG. 1, the cathode contact area CCA is illustrated to be positioned between one side of the first subpixel area SPA1 and the other side of the second subpixel area SPA2 with respect to a first direction X, but the embodiment of the present disclosure is not limited thereto. The cathode contact area CCA may be applied to various locations based on the first subpixel area SPA1 without any particular location limitation. For example, cathode contact area CCA may be positioned on one side or the other side of the first subpixel area SPA1 with respect to a second direction Y. Alternatively, the cathode contact area CCA may be positioned to face an edge of the first subpixel area SPA1.

The electroluminescence display apparatus according to an embodiment of the present disclosure may include a first power line 60 and a second power line 70 disposed in the inactive area IA. Here, a base voltage VSS and a source voltage VDD may be applied to the first power line 60 and the second power line 70, respectively. The first power line 60 and the second power line 70 may be controlled by the panel driving circuit unit 3 to supply the base voltage VSS and the source voltage VDD to the pixels in the active area AA, respectively.

As shown in FIG. 1, a pair of first power lines 60 may be disposed in a bar shape in the inactive areas IA at the top and bottom of the display panel 1 and may include a plurality of first power link lines 62 connecting the pair of first power line 60. In addition, a pair of second power lines 70 may be disposed in a bar shape in the inactive areas IA at the top and bottom of the display panel 1 and may include a plurality of second power link lines 72 connecting the pair of second power lines 70.

In FIG. 1, the first power link line 62 may be disposed to overlap the cathode contact area CCA or to be adjacent to the cathode contact area CCA. In the present disclosure, the cathode contact area CCA may improve reliability by providing a structure in which the first power link line 62 may be electrically contacted with a cathode electrode, which will be described later, and may lower resistance applied to the cathode electrode. Accordingly, the display apparatus having improved luminance uniformity may be provided.

The gate driving circuit 50 supplies gate signals to the gate lines according to a gate control signal provided from the driving circuit unit 3 through a plurality of gate pads of the pad portion PP and a link line. For example, the gate driving circuit 50 may be disposed in at least one of the inactive areas IA on both sides of the substrate 10 facing each other. The gate driving circuit 50 may be formed in a non-display area on one side or both sides of the display area of the display panel 1 by a gate in panel (GIP) method. Alternatively, the gate driver may be manufactured as a driving chip, mounted on a flexible layer, and attached to a non-display area outside one or both sides of the active area of the display panel 1 by a tape automated bonding (TAB) method.

The driving circuit unit 3 according to an example may include a plurality of flexible circuit films 31, a plurality of data driving integrated circuits (ICs) 33, a printed circuit board (PCB) 35, a timing controller 37, and a power circuit unit 39.

Each of the plurality of flexible circuit films 31 may be attached to the pad portion PP and the printed circuit board (PCB) 35 provided on the substrate 10. For example, one side (or output bonding portion) of each of the plurality of flexible circuit films 31 may be attached to the pad portion PP provided on the substrate 10 by a layer attaching process using an anisotropic conductive layer. The other side (or input bonding portion) of each of the plurality of flexible circuit films 31 may be attached to the printed circuit board (PCB) 35 by a layer attaching process using an anisotropic conductive layer.

The plurality of data driving ICs 33 is individually mounted on the plurality of flexible circuit films 31, respectively. Each of the plurality of data driving ICs 33 may receive pixel data and a data control signal provided from the timing controller 37, convert the pixel data into an analog data voltage for each pixel according to the data control signal, and supply the data voltage to a corresponding data line.

The printed circuit board (PCB) 35 may be connected to the other side of each of the plurality of flexible circuit films 31. The printed circuit board (PCB) 35 may serve to transfer signals and voltages between components of the driving circuit unit 3.

The timing controller 37 may be mounted on the printed circuit board (PCB) 35 and receive image data and a timing synchronization signal provided from the display driving system through a user connector disposed on the printed circuit board (PCB) 35.

The timing controller 37 may generate pixel data by aligning the image data to fit a pixel arrangement structure disposed in the active area AA based on the timing synchronization signal, and provide the generated pixel data to each of a plurality of data driving ICs 33.

The timing controller 37 may generate a data control signal and a gate control signal based on the timing synchronization signal, and control a driving timing of each of the plurality of data driving ICs 33 through the data control signal. In addition, the timing controller 37 may control a driving timing of the gate driving circuit 50 through the gate control signal. For example, the timing synchronization signal may include a vertical synchronization signal, a horizontal synchronization signal, a data enable signal, and a main clock (or dot clock).

The power circuit unit 39 may be mounted on the printed circuit board (PCB) 35. In addition, the power circuit unit 39 may generate various power voltages necessary for displaying an image on a pixel using input power supplied from the outside, and may provide the generated voltages to a corresponding circuit.

Figure 2:
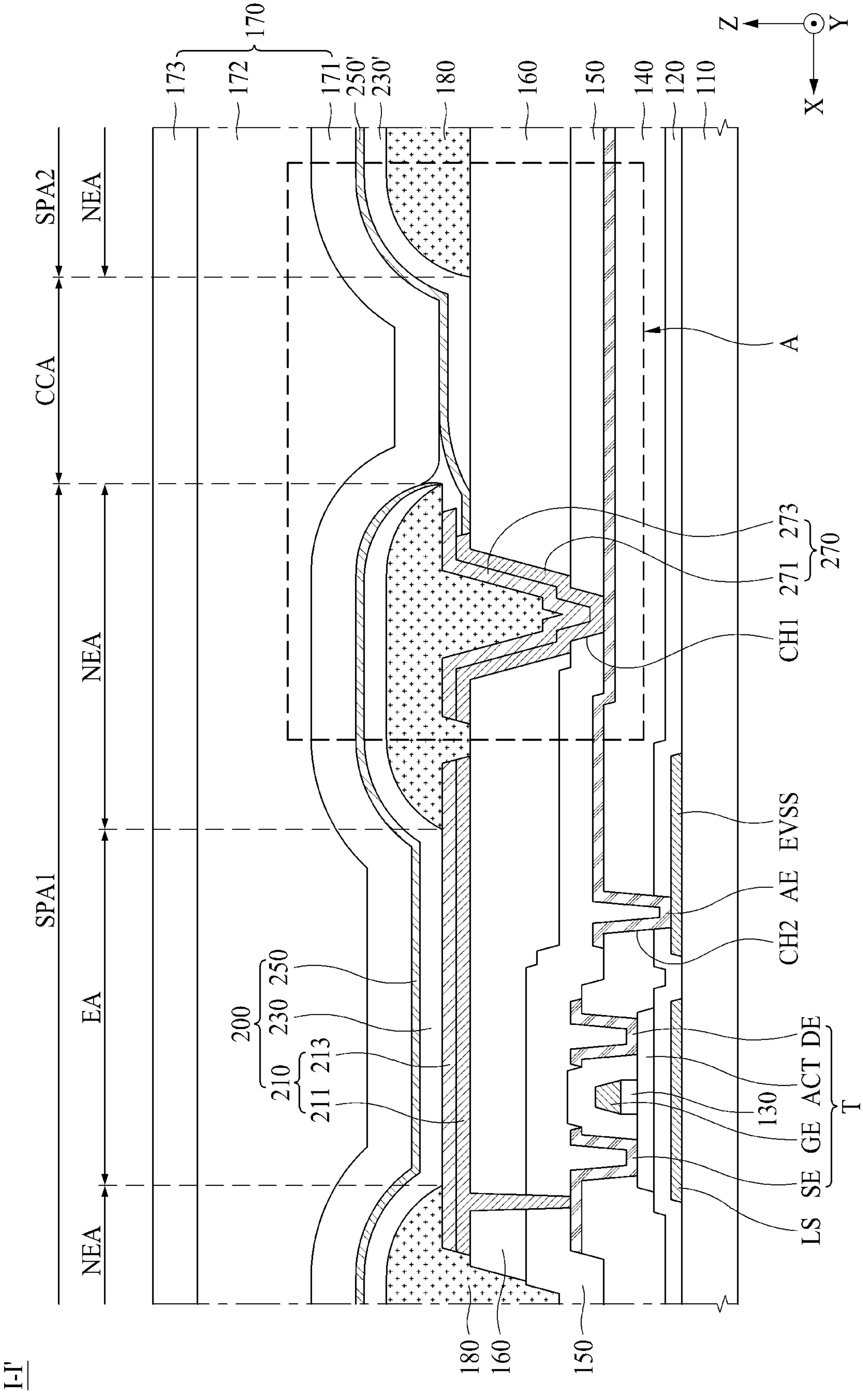
FIG. 2 is a cross-sectional view taken along line I-I' of FIG. 1 according to an embodiment of the present disclosure.
Figure 3:
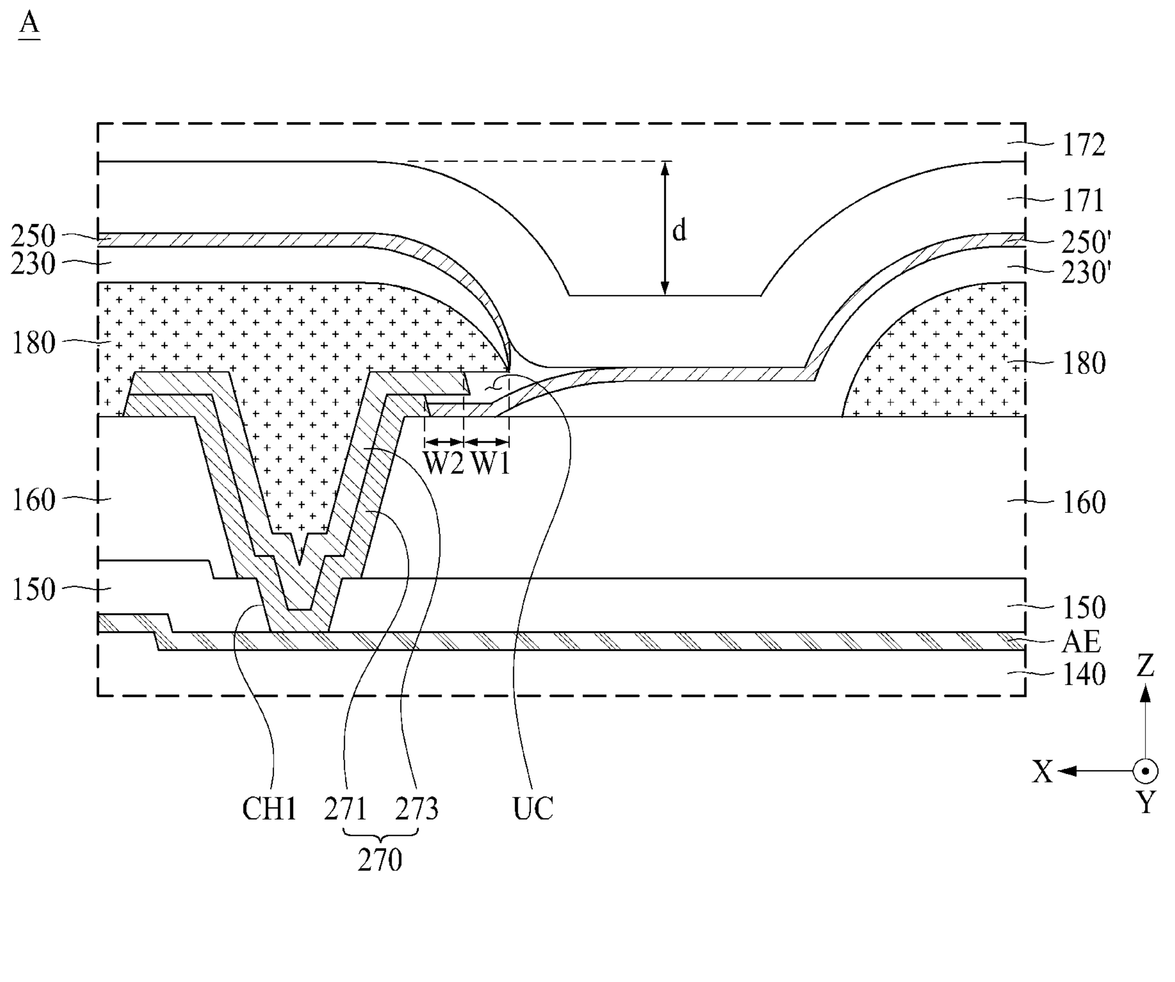
FIG. 3 is an enlarged view of a portion A of FIG. 2 according to an embodiment of the present disclosure.
Figure 4A:
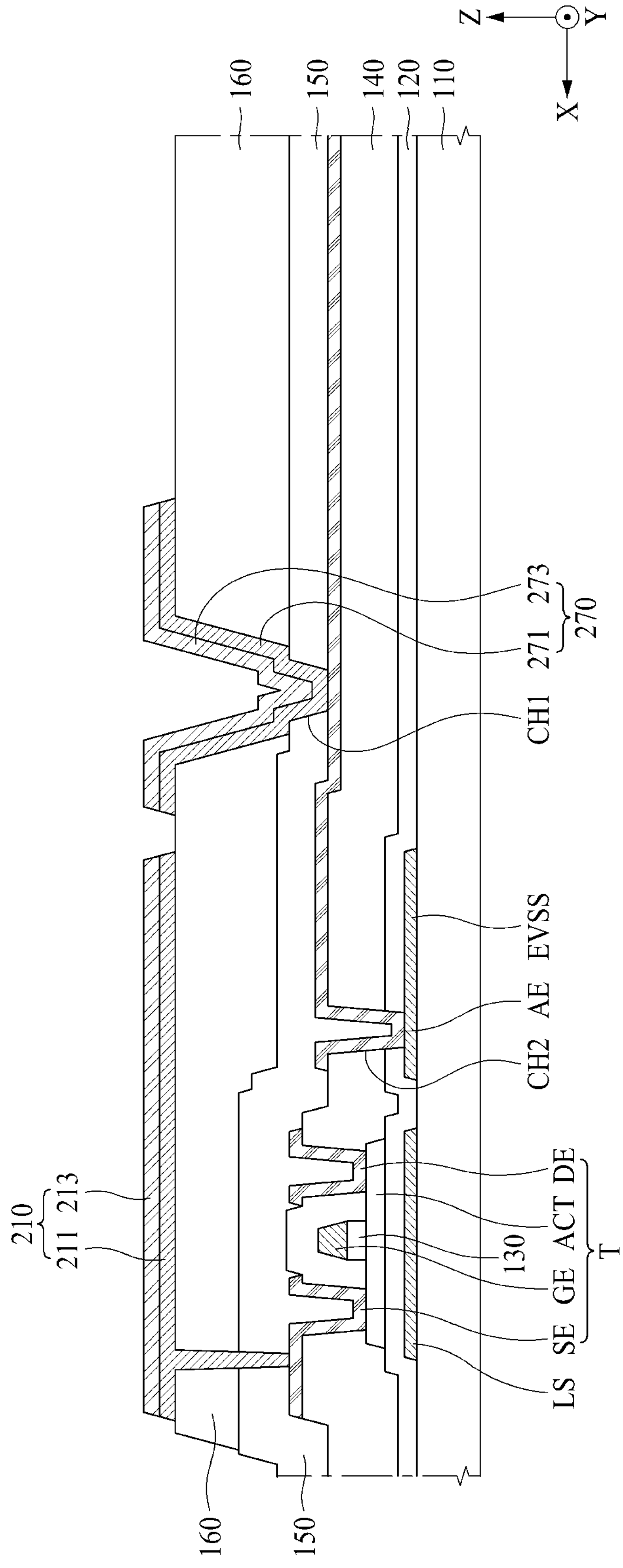
FIGS. 4A to 4D are diagrams illustrating a method for manufacturing an electroluminescence display apparatus according to an embodiment of the present disclosure.
Figure 4B:
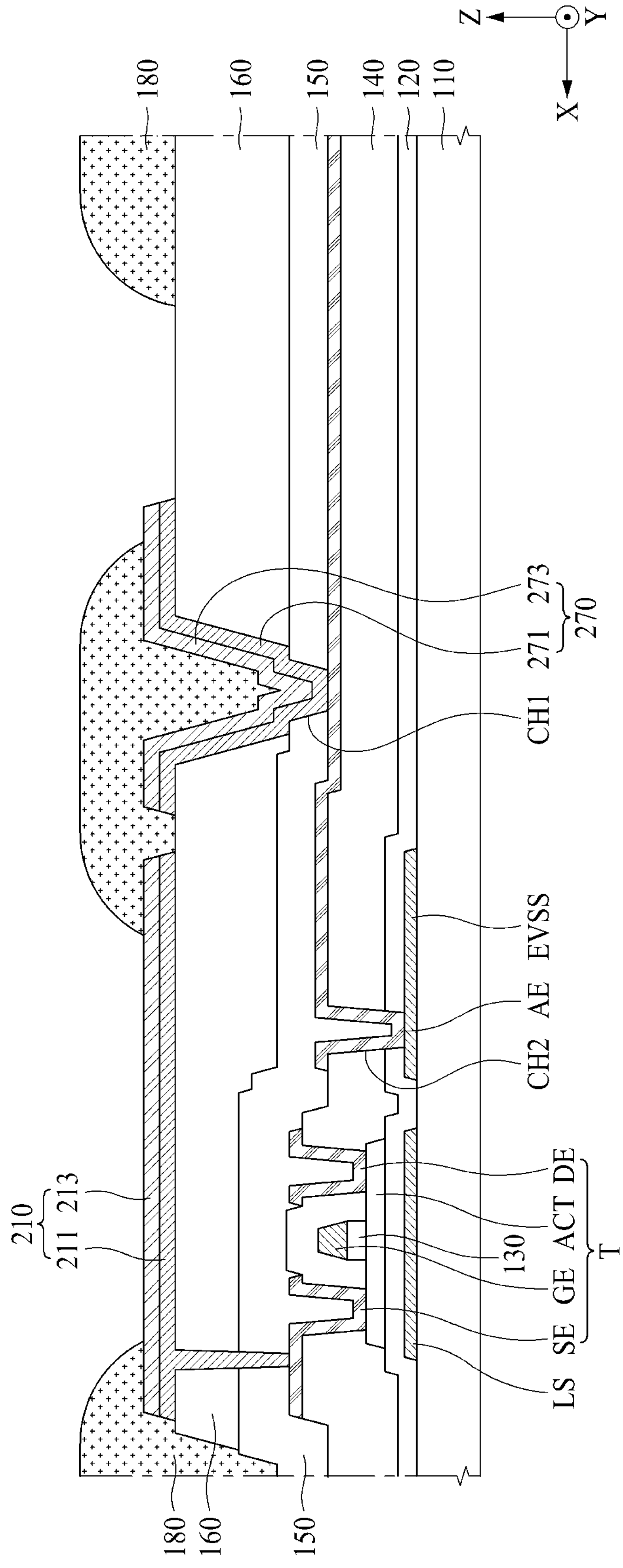
Figure 4C:
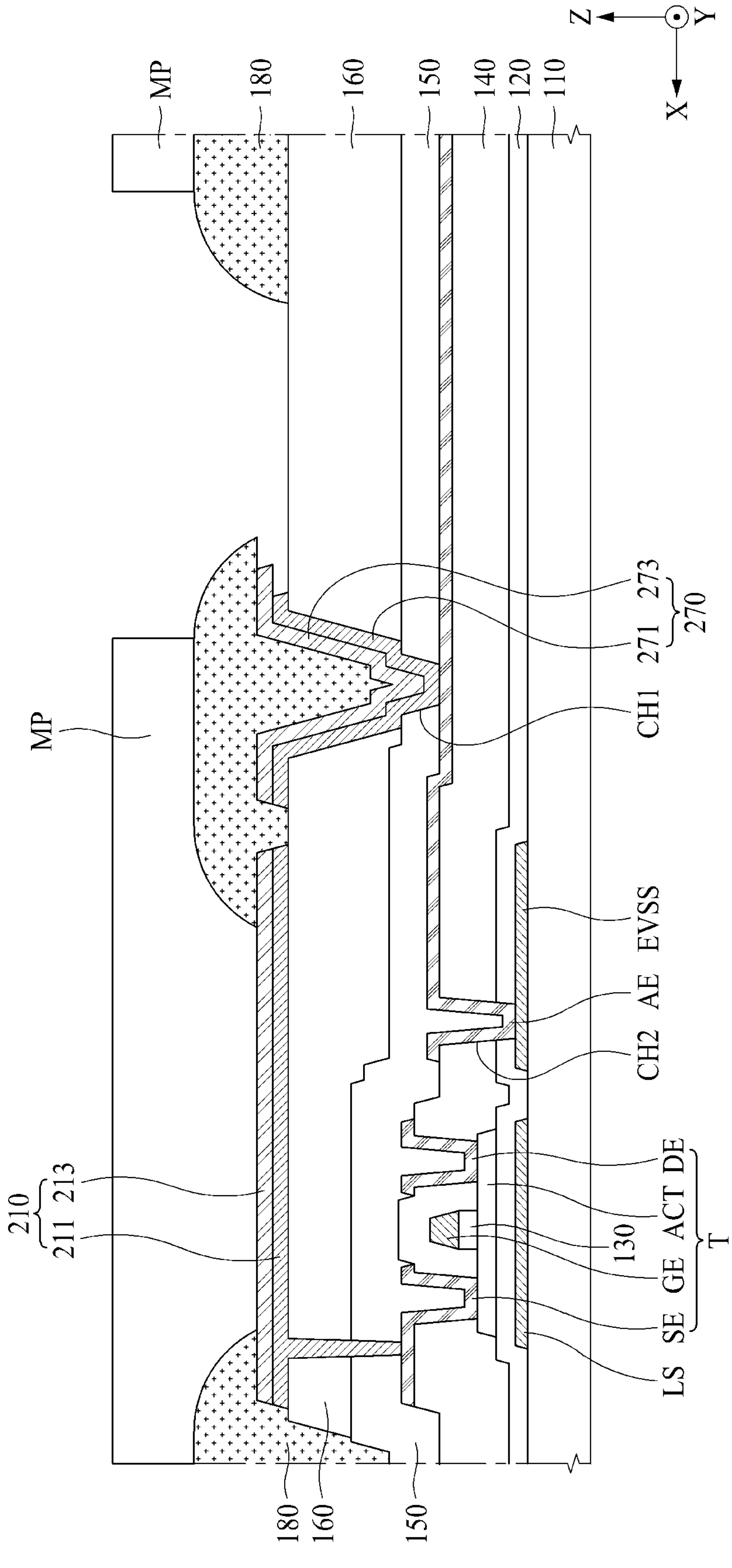
Figure 4D:
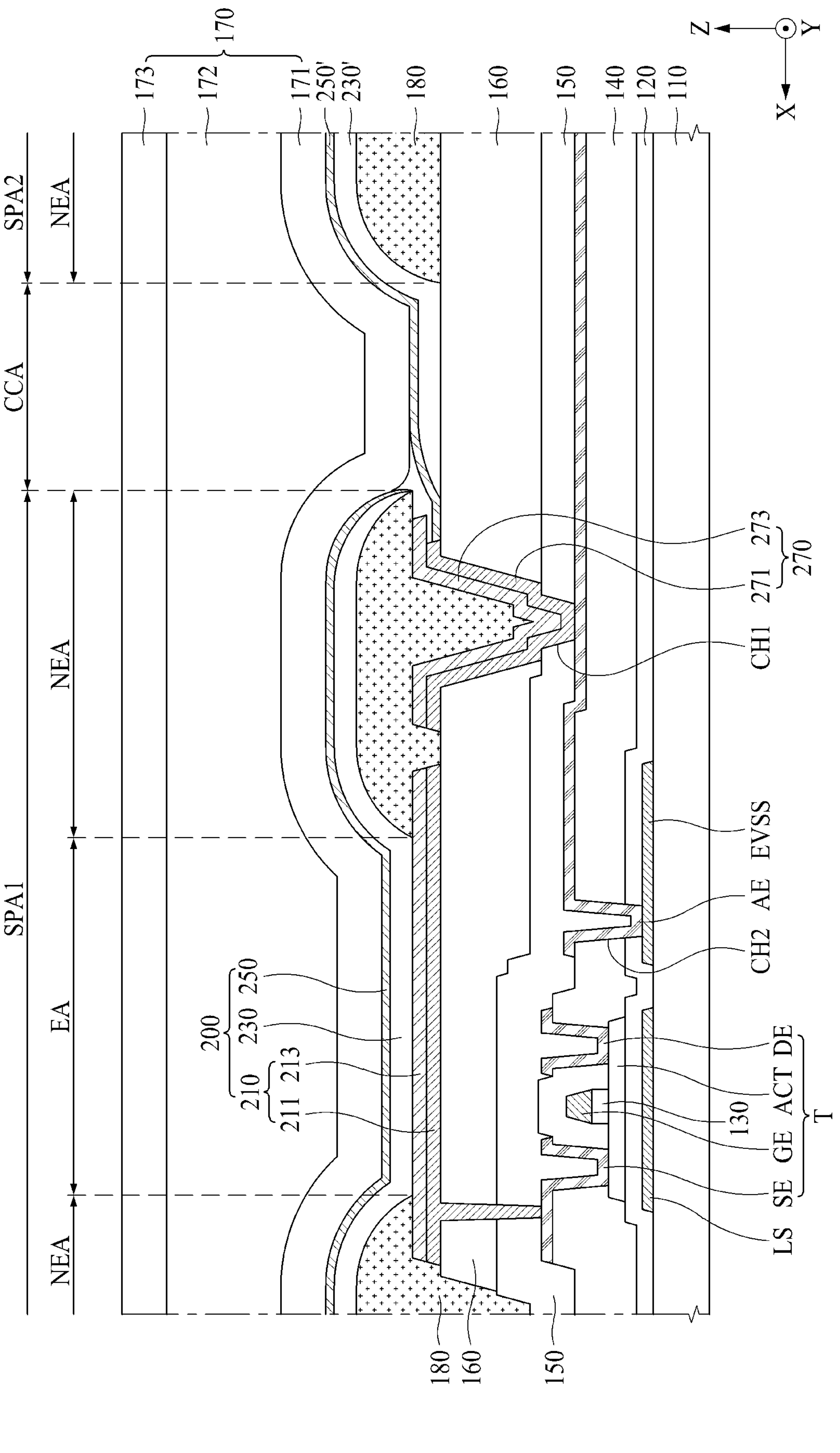

FIG. 2 is a cross-sectional view taken along line I-I' of FIG. 1 according to an embodiment of the present disclosure, and FIG. 3 is an enlarged view of portion A of FIG. 2 according to an embodiment of the present disclosure.

Referring to FIGS. 2 and 3, the electroluminescence display apparatus according to an embodiment of the present disclosure may include a driving TFT T formed on a substrate 110, a planarization layer 160, a light emitting device 200, a bank 180, the cathode contact electrode 270, and an auxiliary power line EVSS.

Here, the substrate 110 may have the same configuration as the substrate 10 described above with reference to FIG. 1. Accordingly, the substrate 110 may be a glass substrate, a bendable thin glass substrate, a plastic substrate, or a silicon substrate.

The driving TFT T may be disposed in the active area AA on the buffer layer 120 and may be disposed to correspond to each of the subpixels. According to an example, the driving TFT T may include an active layer ACT, a gate electrode GE, a source electrode SE, and a drain electrode DE. Although the driving TFT T is shown as a top gate structure in FIG. 4, the embodiment of the present disclosure is not limited thereto, and various known structures may be applied to the driving TFT T. However, in the present disclosure, the driving TFT having a top gate structure will be described.

The buffer layer 120 may be disposed on the substrate 110 and the light blocking layer LS. According to an example, the buffer layer 120 may be formed by stacking a plurality of inorganic layers. For example, the buffer layer 120 may be formed as a multilayer in which one or more inorganic layers of a silicon oxide layer (SiOx), a silicon nitride layer (SiN), and a silicon oxynitride layer (SiON) are stacked.

The active layer ACT may be provided on the buffer layer 120. The active layer ACT may be disposed to overlap the gate electrode GE, the source electrode SE, and the drain electrode DE, and the active layer ACT may include a channel area and a source/drain area. The channel area of the active layer ACT may be formed to overlap the gate electrode GE with the gate insulating layer 130 interposed therebetween. The source/drain areas of the active layer ACT may be formed in parallel with each other with the channel area interposed therebetween. Also, the gate insulating layer 130 may be provided between the channel area of the active layer ACT and the gate electrode GE. The gate insulating layer 130 may insulate the active layer ACT and the gate electrode GE. The active layer ACT may be formed of a silicon-based semiconductor material or an oxide-based semiconductor material.

The gate insulating layer 130 may be provided on the active layer ACT and may be disposed on the buffer layer 120. Also, the gate insulating layer 130 may insulate the active layer ACT and the gate electrode GE. The gate insulating layer 130 may be formed as a single layer or multiple layers including at least one of a silicon nitride layer (SiNx) and a silicon oxide layer ($SiO_2$). The material of the gate insulating layer 130 is not limited thereto.

The gate electrode GE may be provided on the gate insulating layer 130. The gate electrode GE may be formed as a single layer or multiple layers formed of any one of molybdenum (Mo), aluminum (Al), chromium (Cr), gold (Au), silver (Ag), titanium (Ti), nickel (Ni), neodymium (Nd), and copper (Cu), or an alloy thereof.

The interlayer insulating layer 140 may be provided on the gate electrode GE and the gate insulating layer 130. The interlayer insulating layer 140 may function to protect the driving TFT T. A corresponding region of the interlayer insulating layer 140 may be removed to allow the active layer ACT to be in contact with the source electrode SE or the drain electrode DE. For example, the interlayer insulating layer 140 may include a contact hole allowing the source electrode SE and the source area of the active layer ACT to be in contact with each other and a contact hole allowing the drain electrode DE and the drain area of the active layer ACT to be in contact with each other. Also, the interlayer insulating layer 140 may be formed on the gate insulating layer 130. According to an example, the interlayer insulating layer 140 may include a silicon oxide layer ($SiO_2$) or a silicon nitride layer (SiN) or may include a plurality of layers including a silicon oxide layer ($SiO_2$) and a silicon nitride layer (SiN).

The source electrode SE and the drain electrode DE according to an embodiment of the present disclosure may be formed as a single layer or multiple layers formed of any one of molybdenum (Mo), aluminum (Al), chromium (Cr), gold (Au), silver (Ag), titanium (Ti)), nickel (Ni), neodymium (Nd), and copper (Cu) or an alloy thereof. In the present disclosure, a material selected for the source electrode SE and the drain electrode DE to satisfy a certain electrical characteristics required by the driving TFT T may be used.

In addition, a light blocking layer LS disposed below the active layer ACT of the driving TFT T may be further included. The light blocking layer LS may be disposed on the substrate 110 to overlap the driving TFT T. For example, the light blocking layer LS may be formed by depositing a metal layer on the substrate 110 and then performing patterning. The light blocking layer LS may be a single layer or a multi-layer layer formed of a metal such as molybdenum (Mo), aluminum (Al), chromium (Cr), gold (Au), silver (Ag), titanium (Ti), nickel (Ni), neodymium (Nd), and copper (Cu) or an alloy thereof, but is not limited thereto and may be implemented with various materials known in the art. In addition, the light blocking layer LS may include a lower light blocking layer and an upper light blocking layer.

The protective layer 150 may be provided on the interlayer insulating layer 140, the source electrode SE, and the drain electrode DE. The protective layer 150 may function to protect the source electrode SE and the drain electrode DE. The protective layer 150 may include a contact hole allowing the pixel electrode 210 and the source electrode SE to be in contact with each other. Here, the contact hole of the protective layer 150 may overlap and be connected with the contact hole of the planarization layer 160 formed to allow the pixel electrode 210 and the source electrode SE. to be in contact with each other. According to an example, the protective layer 150 may be a single layer including a silicon oxide layer ($SiO_2$) or a silicon nitride layer (SiN). Alternatively, the protective layer 150 may include a plurality of layers including a silicon oxide layer ($SiO_2$) and a silicon nitride layer (SiN).

The protective layer 150 may include a first contact hole CH1 for a contact structure of the cathode contact electrode 270 and the auxiliary electrode AE in the cathode contact area CCA or the subpixel area SPA. The first contact hole CH1 may be formed to overlap at least a portion of a non-emission area NEA of the subpixel area SPA. In this case, the first contact hole CH1 may be provided by removing the entire protective layer 150 in a thickness direction. Accordingly, a stable contact structure of the cathode contact electrode 270 and the auxiliary electrode AE may be provided through the first contact hole CH1 formed in the protective layer 150.

The planarization layer 160 may be disposed on the substrate 110 to overlap subpixel areas including the first and second subpixel areas SPA1 and SPA2. In addition, the planarization layer 160 may be formed to overlap the cathode contact area CCA. Specifically, the planarization layer 160 may overlap the emission area EA of the active area AA so that the emission area EA defined by the light emitting device 200 and the bank 180 is formed to be substantially flat. In addition, the planarization layer 160 may overlap the cathode contact area CCA. In addition, as described above, in the planarization layer 160, since the first contact hole CH1 for the contact structure of the auxiliary electrode AE is formed in the non-emission area NEA adjacent to the cathode contact area CCA, the planarization layer 160 may be provided such that at least a portion thereof is removed in the non-emission area NEA adjacent to the cathode contact area CCA.

The planarization layer 160 may be formed of an organic layer such as acrylic resin, epoxy resin, phenolic resin, polyamide resin, polyimide resin, and etc.

The light emitting device 200 may be disposed on the planarization layer 160 and may be electrically connected to the driving TFT T. The pixel electrode 210 of the light emitting device 200 may contact the source electrode SE of the driving TFT T through a contact hole formed in at least a portion of the planarization layer 160 and the protective layer 150.

According to an embodiment of the present disclosure, the light emitting device 200 may include the pixel electrode 210 formed on the planarization layer 160 and formed in at least a portion of the active area AA on the substrate 110, the cathode electrode 250 formed to face the pixel electrode 210 and formed to overlap the entire active area AA, and the light emitting layer 230 formed between the pixel electrode 210 and the cathode electrode 250 and formed to correspond to the pixel. In addition, the light emitting layer 230 and the cathode electrode 250 may be formed to overlap at least a portion of the inactive area IA adjacent to the active area AA according to a method of preparing the corresponding layer, but is not limited thereto.

The pixel electrode 210 may be provided on the planarization layer 160 and may be electrically connected to the source electrode SE of the driving TFT T. The pixel electrode 210 may contact the source electrode SE of the driving TFT T through a contact hole provided in the planarization layer 160.

The pixel electrode 210 may include a first pixel electrode 211 disposed on the planarization layer 160 and a second pixel electrode 213 disposed on the first pixel electrode 211.

The first pixel electrode 211 may be provided on the planarization layer 160, and the second pixel electrode 213 may be disposed to overlap the first pixel electrode 211.

In this case, the second pixel electrode 213 may be formed to have substantially the same width as the first pixel electrode 211. After the pixel electrode 210 including the first pixel electrode 211 and the second pixel electrode 213 is formed on the planarization layer 160, the pixel electrode 210 may be patterned to be formed using a certain mask pattern and performing an etching process.

Here, an etching process for patterning the pixel electrode 210 may be a dry etching process. Accordingly, as shown in FIGS. 2 and 3, the pixel electrode 210 including the first pixel electrode 211 and the second pixel electrode 213 may be formed through a dry etching process to have a certain inclination on one side and the other side of the pixel electrode 210, and the inclination may be close to substantially 90 degrees. Accordingly, the first pixel electrode 211 and the second pixel electrode 213 may be formed to have substantially the same width.

One side and the other side of the pixel electrode 210 including the first pixel electrode 211 and the second pixel electrode 213 may be covered by the bank 180.

Each of the first pixel electrode 211 and the second pixel electrode 213 may include a metal material.

For example, the first pixel electrode 211 may include at least one of copper (Cu), silver (Ag), palladium (Pd), and aluminum (Al), but is not limited thereto.

For example, the second pixel electrode 213 may include at least one of indium tin oxide (ITO), indium zinc oxide (MO), titanium (Ti), molybdenum (Mo), and a titanium-molybdenum (MoTi) alloy, but is not limited thereto.

In addition, the first pixel electrode 211 may include the same material as that of a first cathode contact electrode 271 to be described later, and the second pixel electrode 213 may include the same material as that of a second cathode contact electrode 273 to be described later.

In addition, the pixel electrode 210 according to an embodiment of the present disclosure may further include a transparent conductive oxide disposed below the first pixel electrode 211 and above the second pixel electrode 213, respectively. Accordingly, when the transparent conductive oxides are included, the pixel electrode 210 according to an embodiment of the present disclosure may be a pixel electrode having a four-layer structure.

The bank 180 may define an emission area EA of each of the subpixel areas. In the emission area EA of each of the subpixel areas, the pixel electrode 210, the light emitting layer 230, and the cathode electrode 250 are sequentially stacked to form an emission region in which holes from the pixel electrode 210 and electrons from the cathode electrode 250 are combined with each other to emit light. In this case, the region in which the bank 180 is formed does not emit light, and thus becomes the non-emission area NEA, and the region in which the bank 180 is not formed and the pixel electrode 210 is exposed may become the emission area EA. Also, the bank 180 may be formed to cover the edge of the pixel electrode 210 and to expose a portion of the pixel electrode 210. Accordingly, the bank 180 may prevent a problem in that luminous efficiency is lowered due to the concentration of current at the end of the pixel electrode 210.

The bank 180 is formed of an organic layer such as an acrylic resin, an epoxy resin, a phenolic resin, a polyamide resin, and a polyimide resin.

The bank 180 may be disposed to cover the cathode contact electrode 270, which will be described later, and may be formed to protrude more than one side of the cathode contact electrode 270 facing the cathode contact area CCA. Also, in the bank 180, the cathode contact electrode 270 including the first cathode contact electrode 271 and the second cathode contact electrode 273 may be used as a mask pattern in an etching process for forming a reverse step structure. Referring to FIGS. 2 and 3, the bank 180 may be disposed to overlap the first contact hole CH1. Accordingly, the first contact hole CH1 may be filled by the bank or the bank 180 may fill a space within the first contact hole CH1.

In addition, the bank 180 may be disposed between the plurality of pixel electrodes 210 and the cathode contact electrode 270 to electrically insulate the pixel electrode 210 and the cathode contact electrode 270 adjacent to each other.

The light emitting layer 230 may be disposed to overlap the pixel electrode 210 of the emission area EA in the first subpixel area SPA1 and may be disposed to cover the bank of the non-emission area NEA. In addition, the light emitting layer 230 may be disposed to overlap the pixel electrode 210 of the emission area EA in the second subpixel area SPA2, like the first subpixel area SPA1, may be disposed to cover the bank of the non-emission area NEA, and may be disposed on the planarization layer 160 to at least partially overlap the cathode contact area CCA.

According to another embodiment of the present disclosure, the light emitting layer 230 may be formed through deposition process to correspond to each subpixel area using a certain mask pattern, and when formed in this way, the light emitting layer 230 may be formed so as not to overlap the cathode contact area CCA. In this disclosure, the light emitting layer 230 will be described on the basis that it is formed without a separate mask pattern in the active area AA.

As shown in FIGS. 2 and 3, the light emitting layer 230 overlapping the first subpixel area SPA1 may be formed to have a tail shape gradually reduced in thickness in the non-emission area NEA adjacent to the cathode contact area CCA. For example, the thickness of the light emitting layer 230 may have a tail shape in which the non-emission area NEA becomes thinner in the region adjacent to the cathode contact area CCA. Accordingly, the thickness of the light emitting layer 230 disposed on the bank located in the non-emission area NEA may have a tail shape that gradually becomes thinner in a portion adjacent to the cathode contact area CCA. A light-emitting layer 230' overlapping the second subpixel area SPA2 may be formed to be flat on the side adjacent to the second subpixel area SPA2 and may have a tail shape in which the thickness gradually decreases in a direction toward the first subpixel area SPA1. Referring to FIGS. 2 and 3, the light-emitting layer 230 disposed in the first subpixel area SPA1 and the light-emitting layer 230' disposed in the second subpixel area SPA2 may have a thin tail shape in which the thickness gradually decreases in thickness in the undercut (UC) area.

According to an example, the light emitting layer 230 may include a hole transporting layer, a light emitting layer, and an electron transporting layer. In this case, when a voltage is applied to the pixel electrode 210 and the cathode electrode 250, holes and electrons move to the light emitting layer through the hole transporting layer and the electron transporting layer, respectively, and are combined with each other in the light emitting layer to emit light. According to an example, the light emitting layer 230 may further include at least one functional layer for improving light emitting efficiency and lifespan of the light emitting layer 230.

The cathode electrode 250 may be provided on the light emitting layer 230, and the cathode electrode 250 may be implemented in the form of an electrode common to the active area AA. In FIGS. 2 and 3, the cathode electrode 250 of the first subpixel area SPA1 and the cathode electrode 250' of the second subpixel area SPA2 are shown to be physically disconnected, but this is only an exemplary drawing of a cutting line I-I' of FIG. 1. In the active area AA in which the cathode contact area CCA is not formed, cathode electrodes of the plurality of subpixel areas may be provided to be connected in common.

Accordingly, the cathode electrode 250 may be a common layer formed in common in the subpixel areas to apply the same voltage. The cathode electrode 250 may be formed of a transparent conductive material (TCO) such as ITO and IZO that may transmit light, or a semi-transmissive conductive material such as magnesium (Mg), silver (Ag), or an alloy of magnesium (Mg) and silver (Ag), but is not limited thereto.

The cathode electrode 250 is formed based on a deposition process similar to the light emitting layer 230, but may have a higher step coverage characteristic than the light emitting layer 230 due to the nature of the inorganic layer. In addition, the cathode electrode 250 may be formed in all regions overlapping the organic light emitting layer 230 in the active area AA and may also be formed to overlap the undercut UC area, which will be described later. Accordingly, the cathode electrode 250' of the second subpixel area SPA2 may be generated to overlap the undercut UC area and may be in contact with one side surface of the first cathode contact electrode 271, which will be described later.

The cathode contact electrode 270 may be adjacent to the cathode contact area CCA and may be formed to overlap at least a portion of the non-emission area NEA surrounding the emission area EA. The cathode contact electrode 270 may be formed to overlap both sidewalls of the first contact hole CH1 formed in the protective layer 150 and the planarization layer 160. For example, at least a part of the cathode contact electrode 270 may extend along a sidewall of the first contact hole CH1 toward an upper surface of the planarization layer 160. In addition, the cathode contact electrode 270 may be formed to overlap at least partially on an upper surface of the planarization layer 160 surrounding the first contact hole CH1. In addition, the cathode contact electrode 270 may extend and protrude to the cathode contact area CCA on the planarization layer 160 to contact the cathode electrode 250' of the second subpixel area SPA2. The cathode electrode 250' may contact a side surface of the cathode contact electrode 270.

The cathode contact electrode 270 may include a first cathode contact electrode 271 and a second cathode contact electrode 273.

In this case, the second cathode contact electrode 273 may be disposed on an upper surface of the first cathode contact electrode 271 and may be disposed to overlap the first cathode contact electrode 271. At least a part of the first cathode contact electrode 271 may extend from an area within the contact hole CH1 formed in the protective layer 150 and the planarization layer 160 to an upper surface of the planarization layer 160, such that a side surface of the first cathode contact electrode 271 is disposed on the upper surface of the planarization layer 160. Moreover, while FIGS. 2 and 3 illustrate an example in which the first cathode contact electrode 271 and the second cathode contact electrode 273 are formed to extend to an upper surface of the planarization layer 160, it should be appreciated that in other embodiments, the first cathode contact electrode 271 and the second cathode contact electrode 273 are formed to extend along a sidewall of the first contact hole CH1 such that a side surface of the first cathode contact electrode 271 or the second cathode contact electrode 273 is disposed on the sidewall of the first contact hole CH1. Also, a width of the second cathode contact electrode 273 may be greater than a width of the first cathode contact electrode 271 and may protrude toward, for example, the cathode contact area. Therefore, due to the first cathode contact electrode 271 and the second cathode contact electrode 273, a reverse step structure may be provided in which the second cathode contact electrode 273 on the first cathode contact electrode 271 further protrude on a side surface in a region in which a side surface of the cathode contact electrode 270 is exposed. In the region in which the side surface of the cathode contact electrode 270 is exposed, the bank 180 and the cathode contact electrode 270 further extend toward the cathode contact area CCA to at least partially overlap the cathode contact area CCA or may overlap at least a portion of the non-emission area NEA of the subpixel area as shown in FIG. 2, according to a design of the electroluminescence display apparatus.

As shown in FIG. 3, the second cathode contact electrode 273 may be provided to form an undercut UC area toward the emission area EA by a first width W1 with respect to the end of the bank 180 toward the cathode contact area CCA, and the first cathode contact electrode 271 may be provided to form an undercut UC area toward the emission area EA by a second width W2 with respect to the end of the second cathode contact electrode 273 toward the cathode contact area CCA.

In this case, the first width W1 may be greater than a thickness of the second cathode contact electrode 273, and the second width W2 may be greater than a thickness of the first cathode contact electrode 271. Accordingly, the sum of the first width W1 and the second width W2 may be greater than the sum of the thickness of the second cathode contact electrode 273 and the thickness of the first cathode contact electrode 271.

The undercut UC area may be defined to have a structure in which the cathode contact electrode 270 including the first cathode contact electrode 271 and the second cathode contact electrode 273 are further etched to the inner side based on the end of the bank 180 toward the cathode contact area CCA and one side of the first cathode contact electrode 271 positioned below the second cathode contact electrode 273 is formed on an inner side than one side of the second cathode contact electrode 273. Specifically, a portion of the bank 180 may protrude beyond a side surface of the first cathode contact electrode 271. The second cathode contact electrode 273 may be disposed on the first cathode contact electrode 271, such that a side surface of the second cathode contact electrode 273 protrudes beyond the side surface of the first cathode contact electrode 271 and a lower surface of the second cathode contact electrode 273 is exposed. The bank 180 may also extend beyond the side surface of the second cathode contact electrode 273 to expose a lower surface of the bank 180.

Accordingly, a stack structure in which the first cathode contact electrode 271, the second cathode contact electrode 273, and the bank 180 are sequentially stacked in the undercut UC area may have a multi-stage reverse step structure. In addition, in FIGS. 2 and 3, the first cathode contact electrode 271 and the second cathode contact electrode 273 are illustrated in an angled form, but a structure of the cathode contact electrode 270 having a profile of the first cathode contact electrode 271 and the second cathode contact electrode 273 having a certain roughness and having a concave or convex inclination may also be considered to be included in the scope of the present disclosure.

According to an embodiment of the present disclosure, as for the stack structure in which the first cathode contact electrode 271, the second cathode contact electrode 273, and the bank 180 are sequentially stacked in the undercut UC area, in an etching process of forming the multi-stage reverse step structure, when the etching process is performed as a single process, an etch rate for the etching process of the first cathode contact electrode 271 may be higher than an etch rate for the etching process of the second cathode contact electrode 273.

Alternatively, as for the stack structure in which the first cathode contact electrode 271, the second cathode contact electrode 273, and the bank 180 are sequentially stacked in the undercut UC area, in an etching process of forming the multi-stage reverse step structure, when the etching process is performed as a plurality of etching processes, for example, two etching processes, the first cathode contact electrode 271 and the second cathode contact electrode 273 may be simultaneously etched in a first etching process, and as described above, an etch rate for the etching process of the first cathode contact electrode 271 may be greater than an etch rate for the etching process of the second cathode contact electrode 273, and the first cathode contact electrode 271 may be etched at a relatively high etch rate in a second etching process.

Therefore, as will be described later with reference to FIGS. 4A to 4D, in the case of forming the exposed side surface of the cathode contact electrode 270 using the bank 180 as a mask pattern, the reverse step structure including the cathode contact electrode 270 including the first cathode contact electrode 271 and the second cathode contact electrode 273 and the bank 180 may be prepared by performing a single etching process or a plurality of etching processes.

Referring to FIGS. 2 and 3, the cathode electrode 250' disposed in the second subpixel area SPA2 may be in contact with and electrically connected to one side surface of the first cathode contact electrode 271 of the cathode contact electrode 270. Thus, at least a portion of the cathode electrode may contact the side surface of the cathode contact electrode 270 in an area below the bank 180, and more specifically, in an area below the protruded portion of the bank 180. The cathode electrode may include a first cathode electrode (e.g., 250) disposed at least in the first subpixel area SPA1 and a second cathode electrode (e.g., 250') disposed in at least the second subpixel area SPA2 and the cathode contact area, and the second cathode electrode may contact a side surface of the first cathode contact electrode 271. In one instance, the first cathode electrode may be physically disconnected from the second cathode electrode. In another instance, the first cathode electrode is integrally formed with the second cathode electrode. In addition, an upper surface of the cathode electrode 250' contacting one side surface of the first cathode contact electrode 271 may be spaced apart from a lower surface of the second cathode contact electrode 273. Accordingly, a thickness of the cathode electrode 250' in contact with one side surface of the first cathode contact electrode 271 may be smaller than a thickness of the first cathode contact electrode 271.

For example, the first cathode contact electrode 271 may include at least one of copper (Cu), silver (Ag), palladium (Pd), and aluminum (Al), but is not limited thereto.

For example, the second cathode contact electrode 273 may include at least one of indium tin oxide (ITO), indium zinc oxide (IZO), titanium (Ti), molybdenum (Mo), and a titanium-molybdenum (MoTi) alloy, but is not limited thereto.

Accordingly, the cathode contact electrode 270 may include the same material as the pixel electrode 210 and may have the same stack structure. Specifically, the first cathode contact electrode 271 may include the same material as the first pixel electrode 211, and the second cathode contact electrode 273 may include the same material as the second pixel electrode 213.

In addition, the cathode contact electrode 270 according to an embodiment of the present disclosure may be disposed to be spaced apart from the pixel electrode 210 on one side and electrically insulated from each other by the bank 180 described above.

A manufacturing method of forming a reverse step structure in a structure in which the first cathode contact electrode 271, the second cathode contact electrode 273, and the bank 180 are stacked will be described later with reference to FIGS. 4A to 4D according to an embodiment of the present disclosure.

The side surface of the first cathode contact electrode 271 exposed in the cathode contact area CCA may contact the cathode electrode 250' of the second subpixel area SPA2.

Accordingly, in the electroluminescence display according to an embodiment of the present disclosure, the cathode contact electrode 270 and the cathode electrodes 250 and 250' are not in surface contact in the cathode contact area CCA, but may be in side surface contact with exposed one side surface of the cathode contact electrode 270 in the non-emission area NEA located on one side of the first subpixel area SPA1. Accordingly, in the electroluminescence display apparatus according to an embodiment of the present disclosure, since the cathode contact electrode 270 and the cathode electrodes 250 and 250' do not require surface contact in the cathode contact area, the cathode contact area CCA may be designed to have a small area and has an advantage in terms of design rules. Here, the surface contact may be defined as a contact between an upper surface of the cathode contact electrode 270 and lower surfaces of the cathode electrodes 250 and 250'.

The auxiliary electrode AE may be disposed on the interlayer insulating layer and may be in contact with the auxiliary power line EVSS to be described later. The auxiliary electrode AE may contact the cathode contact electrode 270 through the first contact hole CH1 described above. Here, the contact between the cathode contact electrode 270 and the auxiliary electrode AE may be made through the contact hole CH1 formed in at least a portion of the protective layer 150 adjacent to the cathode contact area CCA.

The auxiliary power line EVSS may be electrically connected to the auxiliary electrode AE and may include the same material as that of the light blocking layer LS. The auxiliary power line EVSS may be disposed on the substrate 110. Accordingly, the auxiliary power line EVSS may be formed of a single layer or a multi-layer layer including a metal such as copper (Cu), titanium (Ti), molybdenum (Mo), titanium-molybdenum (MoTi) alloy, aluminum (Al), chromium (Cr) and silver (Ag) or an alloy thereof, but is not limited thereto and may be implemented with various materials known in the art.

The first power link line 62 described above with reference to FIG. 1 may have the same configuration as the auxiliary power line EVSS and the auxiliary electrode AE. In FIG. 1, the first power link line 62 is illustrated as a single line due to display restrictions, but may include an auxiliary power supply line EVSS and an auxiliary electrode AE, and a uniform resistance may be applied to 250 to a cathode electrode over the active area AA.

The auxiliary electrode AE may contact the auxiliary power line EVSS through the second contact hole CH2 formed in at least a portion of the interlayer insulating layer 140. Here, the second contact hole CH2 may be provided to remove at least a portion of the buffer layer 120 and the interlayer insulating layer 140 as necessary.

The auxiliary electrode AE may be disposed to be spaced apart from the source electrode SE and the drain electrode DE on the interlayer insulating layer 140 and may be formed of the same material as the source electrode SE and the drain electrode DE and prepared in the same process. The auxiliary electrode AE may have the same stack structure as the source electrode SE and the drain electrode DE. Accordingly, the auxiliary electrode AE may be formed as a single layer or multiple layers including molybdenum (Mo), aluminum (Al), chromium (Cr), gold (Au), silver (Ag), titanium (Ti), nickel (Ni), neodymium (Nd), and copper (Cu) or an alloy thereof.

According to an embodiment of the present disclosure, the planarization layer 160 may include a contact hole through which the pixel electrode 210 penetrates in the emission area EA. Here, the contact hole of the planarization layer 160 may be connected to the contact hole of the protective layer 150 to allow the pixel electrode 210 to penetrate therethrough. For example, the planarization layer 160 may include an organic material such as photo acryl and polyimide.

The encapsulation portion 170 may cover the subpixel areas SPA1 and SPA2 and the cathode contact area CCA, and may cover at least a portion of the inactive area IA. According to an embodiment of the present disclosure, the encapsulation portion 170 may include at least one inorganic layer and at least one organic layer. In addition, the encapsulation portion 170 may have a thin film encapsulation structure in which an inorganic layer and an organic layer are alternately arranged, and may prevent moisture or oxygen from penetrating into the light emitting device 200. For example, the encapsulation portion 170 may include a first encapsulation portion 171, a second encapsulation portion 172, and a third encapsulation portion 173 that are sequentially stacked. In addition, the first encapsulation portion 171 and the third encapsulation portion 173 of the encapsulation portion 170 may be an inorganic layer, and the second encapsulation portion 172 may be an organic layer, but is not limited thereto.

In addition, as shown in FIGS. 2 and 3, the first encapsulation portion 171 may be provided to cover the first subpixel area SPA1, the second subpixel area SPA2, and the cathode contact area CCA.

The electroluminescence display apparatus according to an embodiment of the present disclosure may be provided in a structure including the planarization layer 160 in a region overlapping the cathode contact area CCA. In addition, a step height d between an upper surface of the first encapsulation portion 171 located in the non-emission area NEA of the first subpixel area SPA1 and an upper surface of the first encapsulation portion 171 located in the cathode contact area CCA may be provided at the same level as the sum of the thicknesses of the bank 180 and the cathode contact electrode 270. Accordingly, the step height d between the non-emission portion NEA of the first subpixel area SPA1 and the cathode contact area CCA may be reduced or minimized, and the first encapsulation portion 171 may be formed to cover both the non-emission area NEA of the first subpixel area SPA1 and the cathode contact area CCA without disconnection of the first encapsulation portion 171 in the process of forming the first encapsulation portion 171.

The first encapsulation portion 171 and the third encapsulation portion 173 may include a silicon oxide layer (SiOx) or a silicon nitride layer (SiNx), but is not limited thereto. The first encapsulation portion 171 and the third encapsulation portion 173 may be a multilayer including a silicon oxide layer (SiOx) and a silicon nitride layer (SiNx). The second encapsulation portion 172 may be formed of an organic material, but is not limited thereto.

The step height d may be equal to the sum of the thicknesses of the bank and the cathode contact electrode. In this case, the thickness of the cathode contact electrode 270 may be defined as the sum of the thicknesses of the first cathode contact electrode 271 and the second cathode contact electrode 273 formed on the planarization layer 160. In addition, the thickness of the bank 180 may be defined as the thickness of the bank 180 from the upper surface of the cathode contact electrode 270 on the planarization layer 160.

In the electroluminescence display apparatus of the related art, a step height greater than or equal to the thickness of the planarization layer may be formed in the non-light emitting portion of the subpixel area and the cathode contact area, so that a concave portion or seam may occur due to an unfilled area when the first encapsulation portion is formed, and the concave portion or seam caused by such an unfilled area may act as a moisture permeation path or may cause reliability problems due to structural instability.

FIGS. 4A to 4D show a sequential process of a method for manufacturing an electroluminescence display apparatus according to an embodiment of the present disclosure.

Referring to FIGS. 4A to 4D, the pixel electrode 210 including the first pixel electrode 211 and the second pixel electrode 213 and the cathode contact electrode 270 including the first cathode contact electrode 271 and the second cathode contact electrode 273 may be prepared through a deposition process.

The pixel electrode 210 and the cathode contact electrode 270 may be patterned in a predetermined region using a mask pattern. Here, the predetermined region may be a region corresponding to the emission area EA in the case of the pixel electrode 210, and the cathode contact electrode 270 may be a region corresponding to the non-emission area NEA adjacent to the cathode contact area CCA. Also, the first cathode contact electrode 271 and the second cathode contact electrode 273 may be formed of the same material as the first pixel electrode 211 and the second pixel electrode 213. Accordingly, the pixel electrode 210 and the cathode contact electrode 270 may be formed in a single process.

Accordingly, at this time, one side surface and the other side surface of the cathode contact electrode 270 may have an inclination by an etching process of a normal taper like the one side surface and the other side surface of the pixel electrode 210.

Next, the bank 180 for dividing the emission area EA and insulating the pixel electrode 210 and the cathode contact electrode 270 is formed. In this case, the bank 180 may be disposed to cover the entire cathode contact electrodes 270 adjacent to the pixel electrode 210 and may be formed to expose the cathode contact electrode 270 adjacent to the cathode contact area CCA or overlapping the cathode contact area CCA.

Next, in order to form the reverse step structure including the cathode contact electrode 270 including the first cathode contact electrode 271 and the second cathode contact electrode 273 and the bank 180, a certain mask pattern MP may be formed in a region other than the cathode contact area CCA and an etching process of the cathode contact electrode 270 may be performed. In addition, the bank 180 may also act as a mask for etching the cathode contact electrode 270.

The cathode contact electrode 270 may be formed using a material having a different etch rate for the etching process used in the patterning process, and in this case, when the etching process is performed as a single process, an etch rate for the etching process of the electrode 271 may be set to have a higher value than an etch rate for the etching process of the second cathode contact electrode 273. Here, the etching process may be wet etching. Accordingly, the etch rate of an etchant used in the wet etching process may be greater for the first cathode contact electrode 271 than the second cathode contact electrode 273. Here, as the etchant, a known wet etchant for metal etching may be used. In addition, the above etching process is not limited to wet etching and a dry etching process may be used when the etch rate of the first cathode contact electrode 271 and the etch rate of the second cathode contact electrode 273 are set to be different through the dry etching process.

In addition, according to another embodiment of the present disclosure, in order to form the reverse step structure including the cathode contact electrode 270 including the first cathode contact electrode 271 and the second cathode contact electrode 273 and the bank 180, if the etching process is performed as a plurality of processes, for example, two etching processes are performed, the first cathode contact electrode 271 and the second cathode contact electrode 273 may be simultaneously performed in a first etching process, and as described above, an etch rate for the etching process of the first cathode contact electrode 271 may be greater than the etch rate for the etching process of the second cathode contact electrode 273 and the first cathode contact electrode 271 may be etched with a relatively high etch rate in the second etching process. Accordingly, in the case of the cathode contact electrode 270 including the first cathode contact electrode 271 and the second cathode contact electrode 273, when the aforementioned etching process is used, the second cathode contact electrode 273 may be disposed to overlap to correspond to the first cathode contact electrode 271 using a single process, and a width of the second cathode contact electrode 273 may be greater than a width of the first cathode contact electrode 271.

Next, the light emitting layer 230 and the cathode electrode 250 of the light emitting device 200 are formed. In this case, the cathode electrode 250' of the second subpixel area SPA2 may be in contact with one side surface of the cathode contact electrode 270 in the non-emission area NEA adjacent to the cathode contact area CCA, and specifically, in contact with one side surface of the first cathode contact electrode 271.

Therefore, as described above, the cathode contact electrode 270 including the first cathode contact electrode 271 and the second cathode contact electrode 273 may have a reverse step structure in the portion where the side surface is exposed. In addition, as shown in FIGS. 2 and 3, the reverse step structure formed on one side of the cathode contact electrode 270 including the first cathode contact electrode 271 and the second cathode contact electrode 273 is covered by the bank 180, and the reverse step structure formed on the other side surface of the cathode contact electrode 270 including the first cathode contact electrode 271 and the second cathode contact electrode 273 may be provided in a form exposed in the cathode contact area, without being covered by the bank 180.

Here, the side surface of the cathode contact electrode 270 exposed in the cathode contact area may contact the cathode electrode 250' of the light emitting device of the second subpixel area SPA2.

According to an embodiment of the present disclosure, there is an effect of providing uniform resistance of the cathode electrode over the entire active area of the electroluminescence display apparatus.

In addition, according to an embodiment of the present disclosure, there is an effect that a path for moisture permeation is blocked in the cathode contact area of the electroluminescence display apparatus.

The effect of the present disclosure is not limited to the above-mentioned effects, and other effects not mentioned herein will be clearly understood by those skilled in the art from the following description.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescence display apparatus comprising:

a substrate including a plurality of subpixel areas including an emission area and a non-emission area surrounding the emission area and a cathode contact area located on at least one side between the plurality of subpixel areas;

a planarization layer disposed on the substrate and configured to overlap each of the emission area and the cathode contact area;

a light emitting device disposed on the planarization layer and configured to overlap the emission area, and the light emitting device including a pixel electrode and a cathode electrode facing the pixel electrode, and a light emitting layer between the pixel electrode and the cathode electrode;

a cathode contact electrode formed on the planarization layer and formed to overlap at least a portion of the non-emission area;

a bank disposed on the pixel electrode and configured to divide the emission area; and an undercut structure in which the cathode contact electrode is formed on an inner side at one end of the bank adjacent to the cathode contact area, wherein the cathode contact electrode includes a first cathode contact electrode and a second cathode contact electrode configured to further protrude than the first cathode contact electrode toward the cathode contact area on the first cathode contact electrode, wherein the first cathode contact electrode includes one side surface exposed toward the cathode contact area, and wherein the cathode electrode is in contact with the one side surface of the first cathode contact electrode, wherein the bank, the second cathode contact electrode, and the first cathode contact electrode are provided in a reverse step structure in the undercut structure.

2. The electroluminescence display apparatus of claim 1, wherein the pixel electrode includes a first pixel electrode and a second pixel electrode configured to overlap the first pixel electrode, wherein the second cathode contact electrode is configured to partially overlap the first cathode contact electrode.

3. The electroluminescence display apparatus of claim 1, wherein the subpixel area includes:

a first subpixel area disposed on the substrate; and a second subpixel area positioned adjacent to the first subpixel area, wherein the cathode contact area is positioned in at least a portion between the first subpixel area and the second subpixel area, and the one side surface of the first cathode contact electrode is in contact with the cathode electrode disposed in the second subpixel area.

4. The electroluminescence display apparatus of claim 1, further comprising:

a first encapsulation portion configured to cover the plurality of subpixel areas and the cathode contact area, wherein the first encapsulation portion is formed to have a step height in the non-emission area and the cathode contact area, and the step height is equal to the sum of thicknesses of the bank and the cathode contact electrode.

5. The electroluminescence display apparatus of claim 1, further comprising:

a driving thin film transistor (TFT) disposed in a subpixel area and including an active layer, a gate electrode, a source electrode, and a drain electrode;

a protective layer disposed below the planarization layer and configured to cover the driving TFT;

an interlayer insulating layer disposed between the protective layer and the substrate; and a light blocking layer disposed below the driving TFT.

6. The electroluminescence display apparatus of claim 5, further comprising:

an auxiliary electrode disposed on the interlayer insulating layer and in contact with the cathode contact electrode through a first contact hole formed in at least a portion of the planarization layer.

7. The electroluminescence display apparatus of claim 6, wherein the auxiliary electrode includes a same material as a material of the source electrode and the drain electrode of the driving TFT.

8. The electroluminescence display apparatus of claim 6, further comprising:

an auxiliary power line disposed to be spaced apart from the light blocking layer on the substrate and configured to overlap at least a portion of the plurality of subpixel areas, wherein the auxiliary power line includes a same material as a material of the light blocking layer.

9. The electroluminescence display apparatus of claim 8, wherein the auxiliary electrode is in contact with the auxiliary power line through a second contact hole formed in at least a portion of the interlayer insulating layer.

10. A display apparatus comprising:

a substrate including a plurality of subpixel areas including a first subpixel area, a second subpixel area, and a contact area between the first subpixel area and the second subpixel area;

a light emitting device in the first subpixel area on an insulation layer, the light emitting device including a first electrode, a light emitting layer, and at least a part of a second electrode;

a first contact electrode configured to receive voltage from a first power line on the substrate, wherein at least a part of the first contact electrode extends from an area within a contact hole formed in the insulation layer to an upper surface of the insulation layer;

a bank on at least the first electrode of the light emitting device and the first contact electrode, wherein a portion of the bank protrudes beyond a side surface of the first contact electrode;

a second contact electrode between the first contact electrode and the bank; and an undercut structure in which the first contact electrode and the second contact electrode are formed on an inner side at one end of the bank, wherein at least a portion of the second electrode contacts the side surface of the first contact electrode, wherein the bank, the second contact electrode, and the first contact electrode are provided in a reverse step structure in the undercut structure.

11. The display apparatus of claim 10, wherein a side surface of the second contact electrode protrudes beyond the side surface of the first contact electrode to expose a lower surface of the second contact electrode.

12. The display apparatus of claim 10, wherein the portion of the second electrode contacting the side surface of the first contact electrode is spaced apart from a lower surface of the second contact electrode.

13. The display apparatus of claim 10, wherein the protruded portion of the bank extends beyond a side surface of the second contact electrode to expose a lower surface of the bank.

14. The display apparatus of claim 10, wherein the portion of the second electrode is not in contact with an upper surface of the first contact electrode.

15. The display apparatus of claim 10, wherein a part of the bank is disposed to fill a space within the contact hole.

16. The display apparatus of claim 10, wherein the second electrode includes a first cathode electrode in the first subpixel area and a second cathode electrode disposed along the second subpixel area and the contact area, and wherein the second cathode electrode contacts the side surface of the first contact electrode, the first cathode electrode disconnected from the second cathode electrode.

17. The display apparatus of claim 10, further comprising an auxiliary electrode on the substrate electrically connected to the first power line, wherein the contact hole exposes a part of the auxiliary electrode, and wherein the first contact electrode contacts the exposed part of the auxiliary electrode.

18. The display apparatus of claim 17, further comprising a driving thin film transistor (TFT) disposed in the first subpixel area, the driving TFT including a source electrode and a drain electrode, wherein the auxiliary electrode includes a same material as a material of the source electrode and the drain electrode.

19. The display apparatus of claim 10, further comprising a light blocking layer below a driving TFT, wherein the first power line includes a same material as the light blocking layer.

* * * * *